(12) United States Patent
Teramoto et al.

(10) Patent No.: US 10,199,606 B2
(45) Date of Patent: Feb. 5, 2019

(54) DISPLAY UNIT AND ELECTRONIC APPARATUS

(71) Applicant: SONY CORPORATION, Tokyo (JP)

(72) Inventors: Kazuma Teramoto, Kanagawa (JP); Takahide Ishii, Kanagawa (JP); Kaoru Abe, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/532,875

(22) PCT Filed: Nov. 11, 2015

(86) PCT No.: PCT/JP2015/081718
§ 371 (c)(1),
(2) Date: Jun. 2, 2017

(87) PCT Pub. No.: WO2016/093009
PCT Pub. Date: Jun. 16, 2016

(65) Prior Publication Data
US 2017/0338444 A1      Nov. 23, 2017

(30) Foreign Application Priority Data

Dec. 11, 2014   (JP) .................................. 2014-251197

(51) Int. Cl.
   *H01L 27/32*        (2006.01)
   *H01L 51/52*        (2006.01)
(52) U.S. Cl.
   CPC ...... *H01L 51/5271* (2013.01); *H01L 27/3211* (2013.01); *H01L 27/3246* (2013.01); *H01L 2251/5315* (2013.01)

(58) Field of Classification Search
   CPC .................... H01L 27/3246; H01L 27/3218
   See application file for complete search history.

(56) References Cited

U.S. PATENT DOCUMENTS

2014/0306200 A1   10/2014   Jinta et al.

FOREIGN PATENT DOCUMENTS

| | | |
|---|---|---|
| CN | 104103667 A | 10/2014 |
| JP | 2004-335180 A | 11/2004 |
| JP | 2007-280622 A | 10/2007 |
| JP | 2009-81097 A | 4/2009 |
| JP | 2009-081097 A | 4/2009 |
| JP | 2013-58324 A | 3/2013 |
| JP | 2013-058324 A | 3/2013 |
| JP | 2013-191533 A | 9/2013 |
| JP | 2014-207105 A | 10/2014 |
| KR | 10-2014-0123002 A | 10/2014 |
| TW | 201440216 A | 10/2014 |

OTHER PUBLICATIONS

International Search Report and Written Opinion of PCT Application No. PCT/JP2015/081718, dated Feb. 2, 2016, 02 pages of English Translation and 07 pages of ISRWO.

*Primary Examiner* — Thomas L Dickey
(74) *Attorney, Agent, or Firm* — Michael Best & Friedrich LLP

(57) ABSTRACT

A display unit of the present disclosure includes: a plurality of pixels that are disposed in a regular manner; a plurality of first openings that are provided in each of the plurality of pixels; and one or more second openings that are provided in at least a portion of a peripheral edge of each of the plurality of pixels that are disposed in a regular manner.

11 Claims, 15 Drawing Sheets

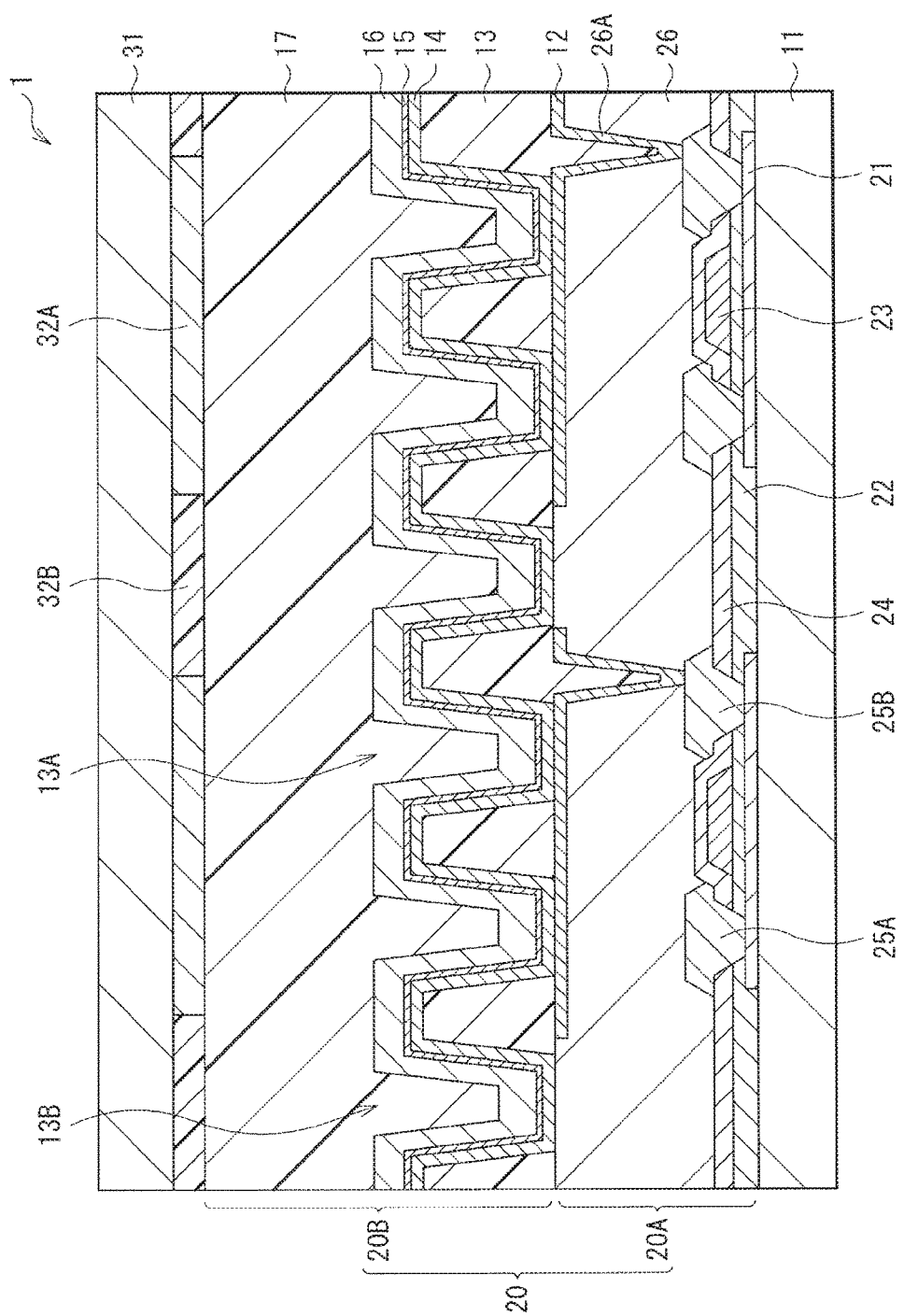
[FIG. 1]

[ FIG. 2 ]
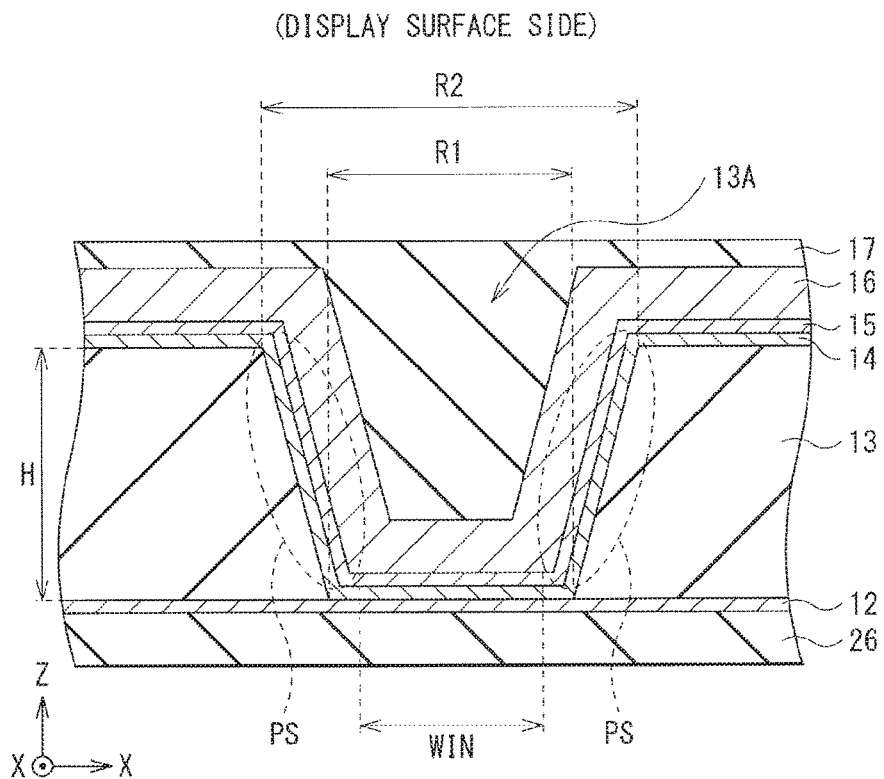
[ FIG. 3 ]
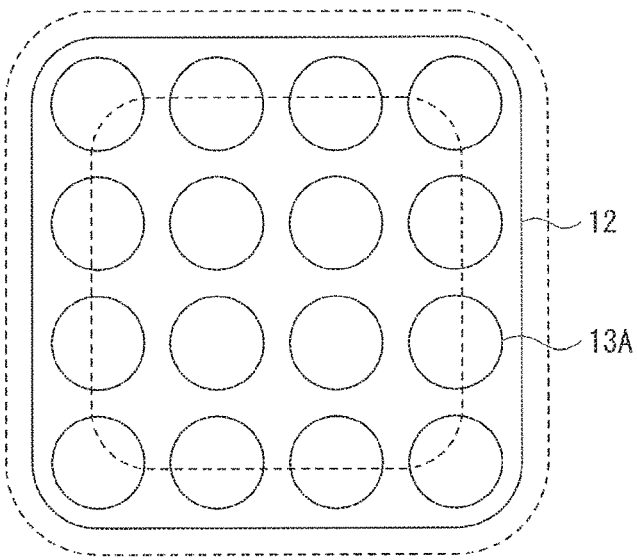

[ FIG. 4A ]
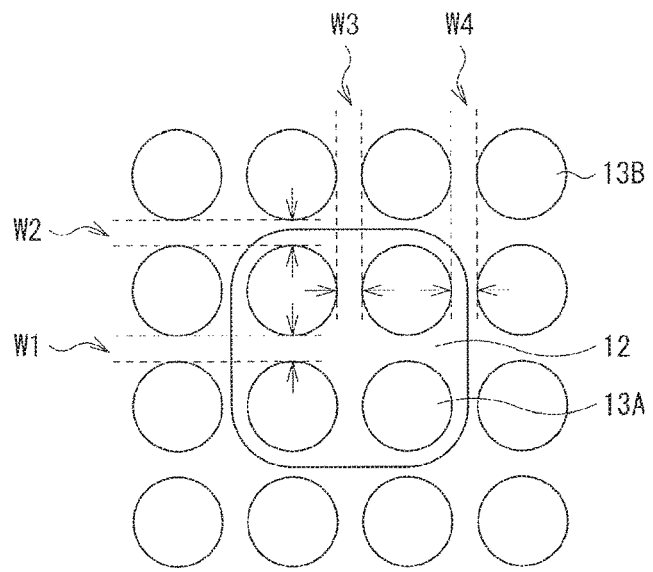
[ FIG. 4B ]
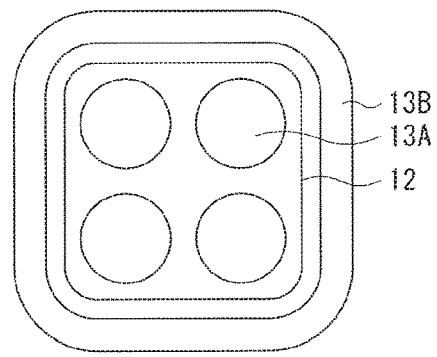
[ FIG. 4C ]
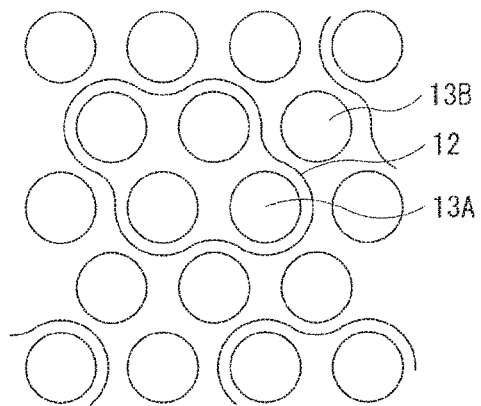

[FIG. 5]
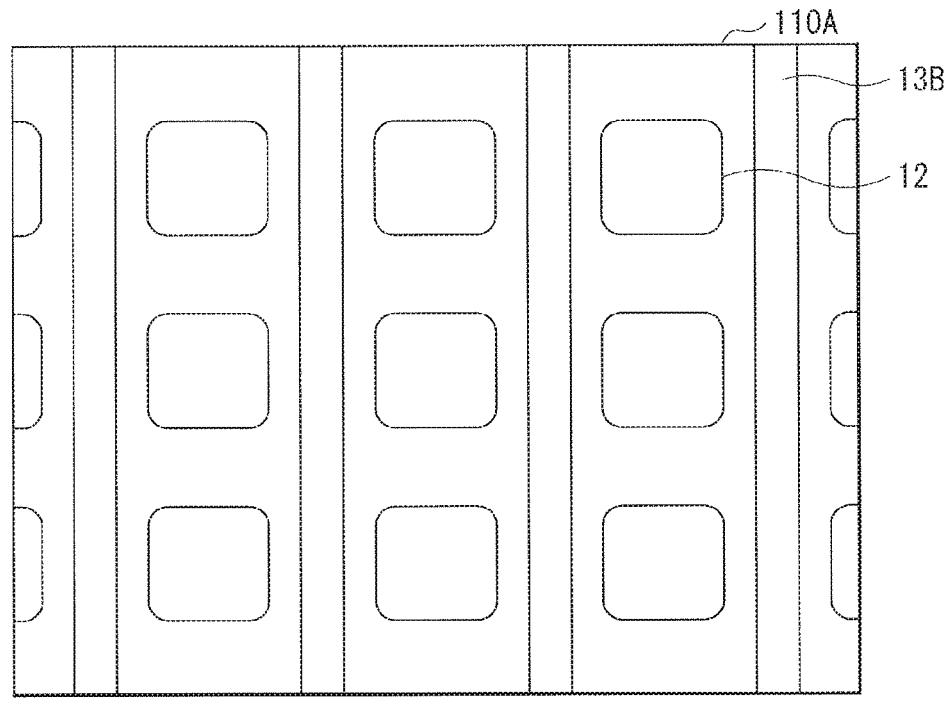
[FIG. 6]
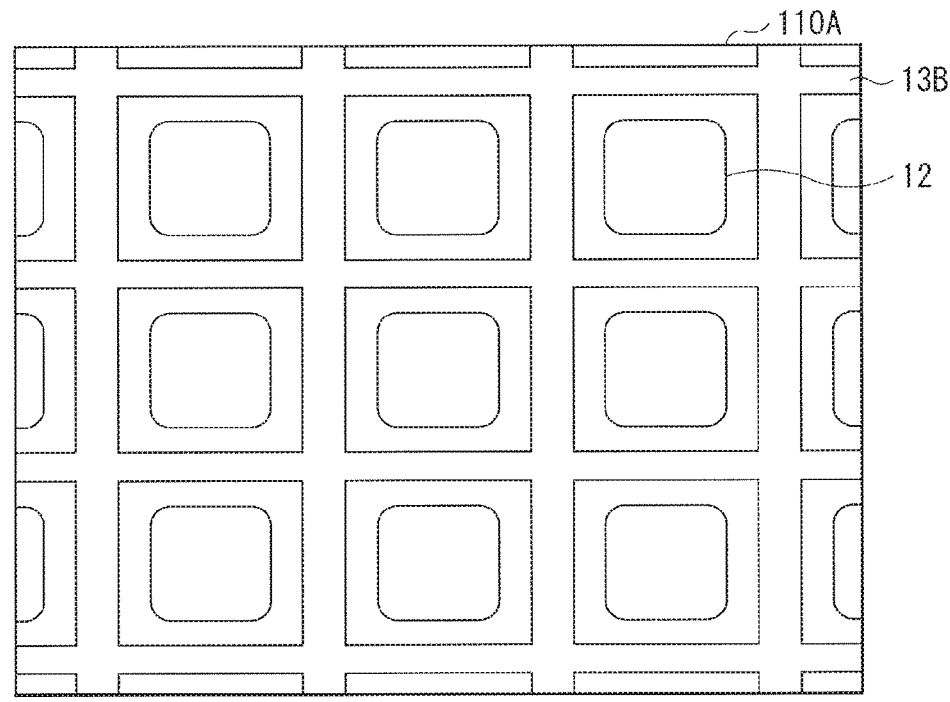

[ FIG. 7 ]
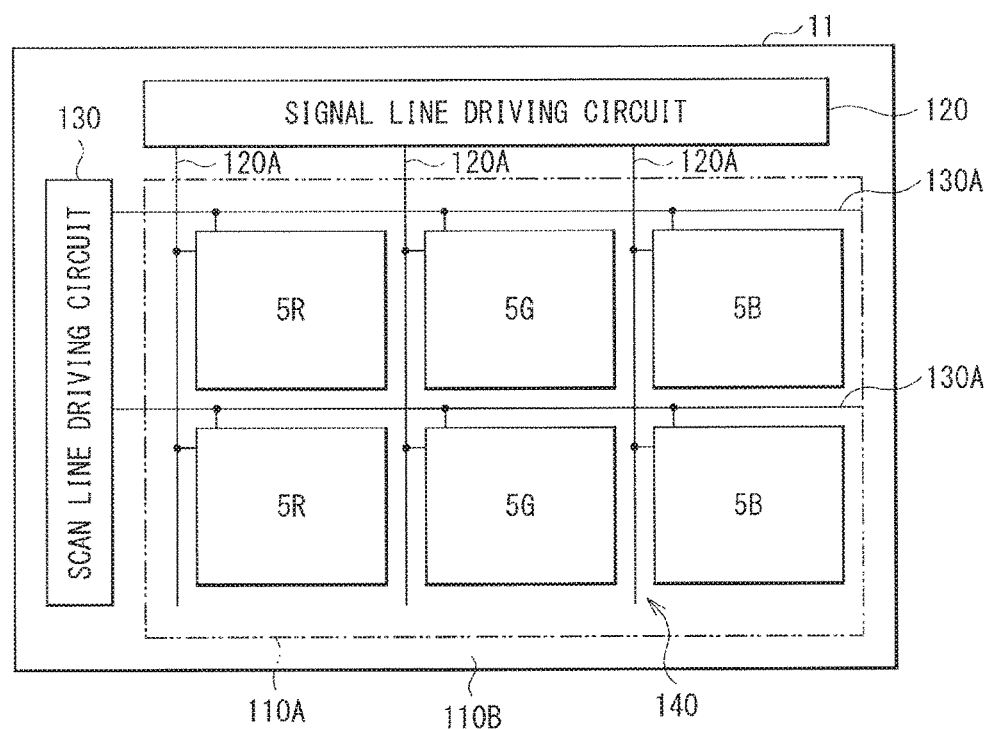
[ FIG. 8 ]
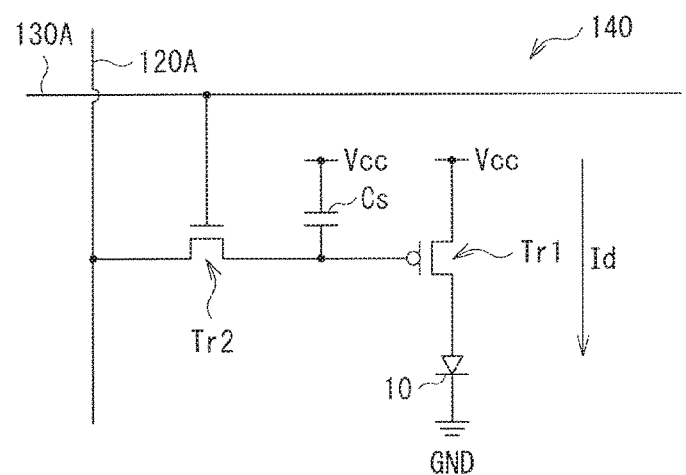

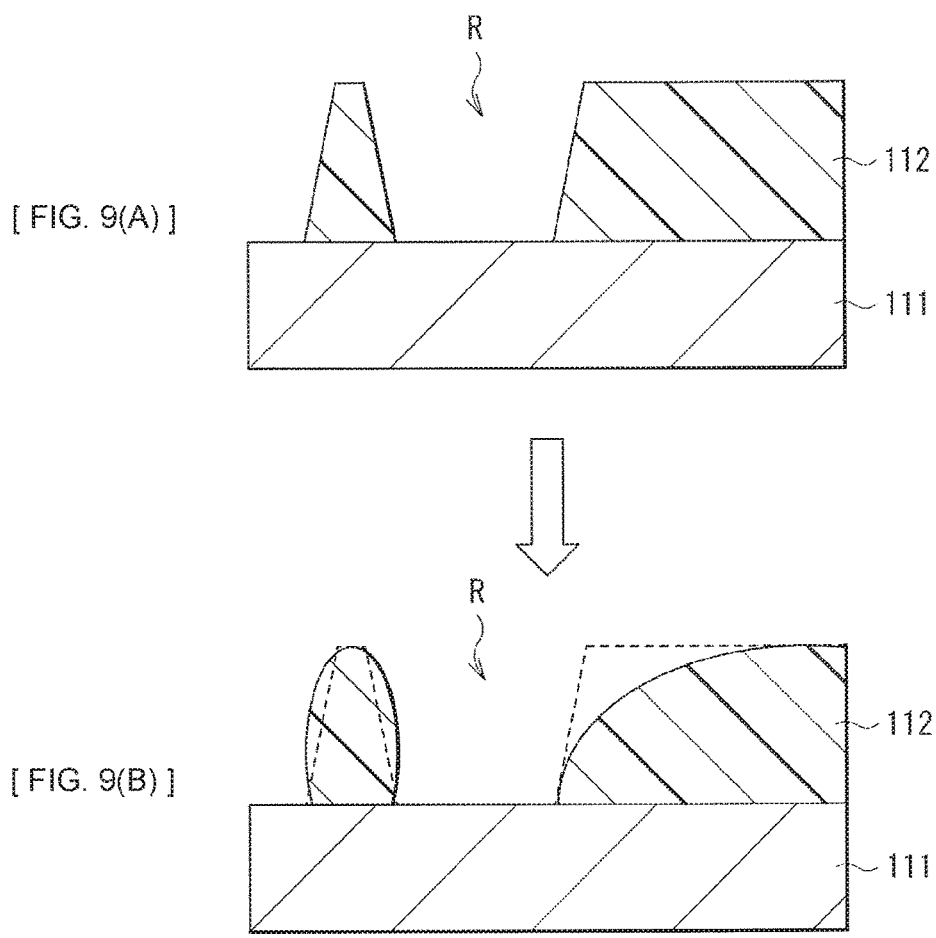

[ FIG. 10 ]
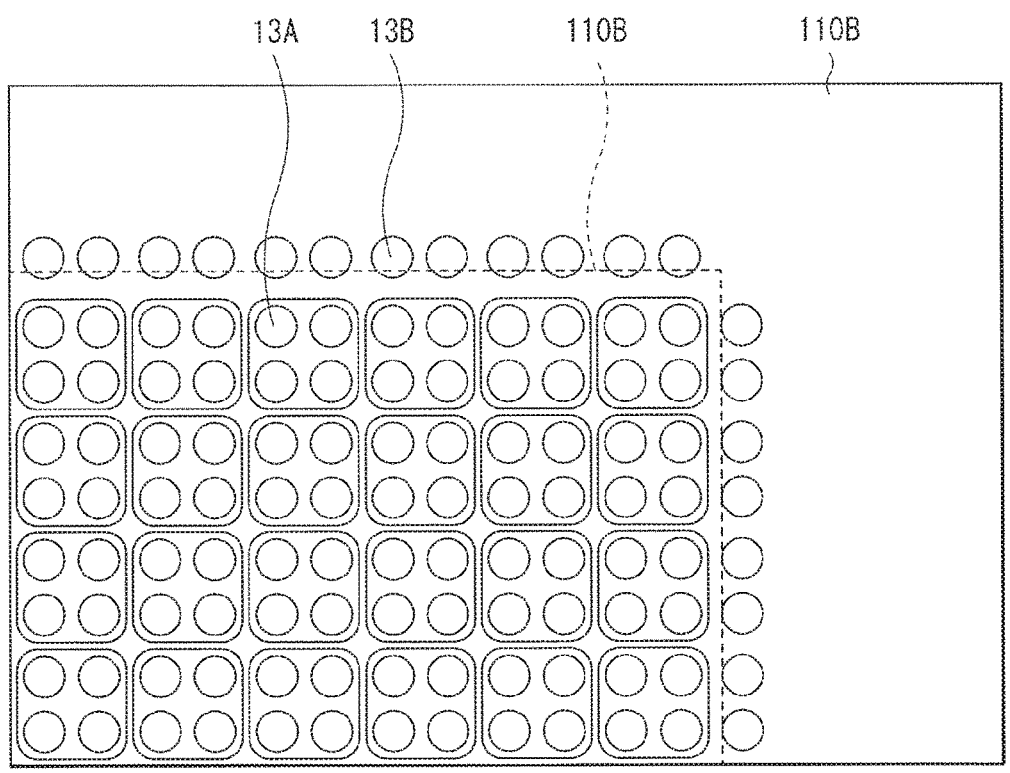

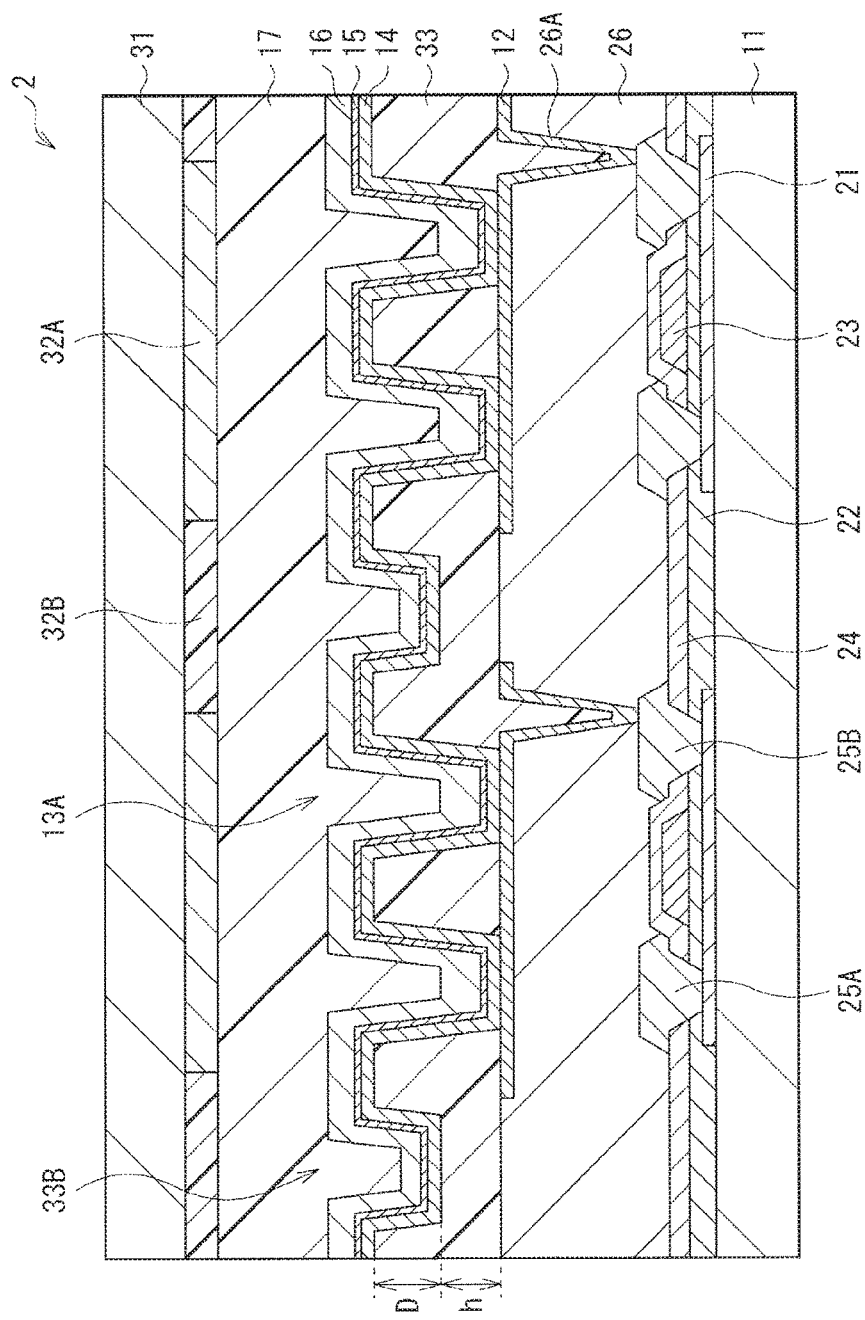
[FIG. 11]

[ FIG. 12 ]
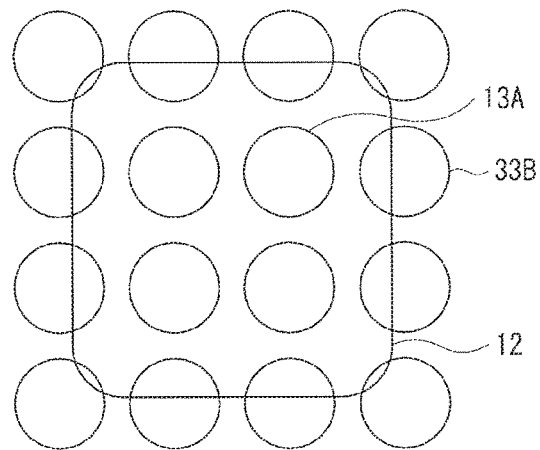
[ FIG. 13 ]
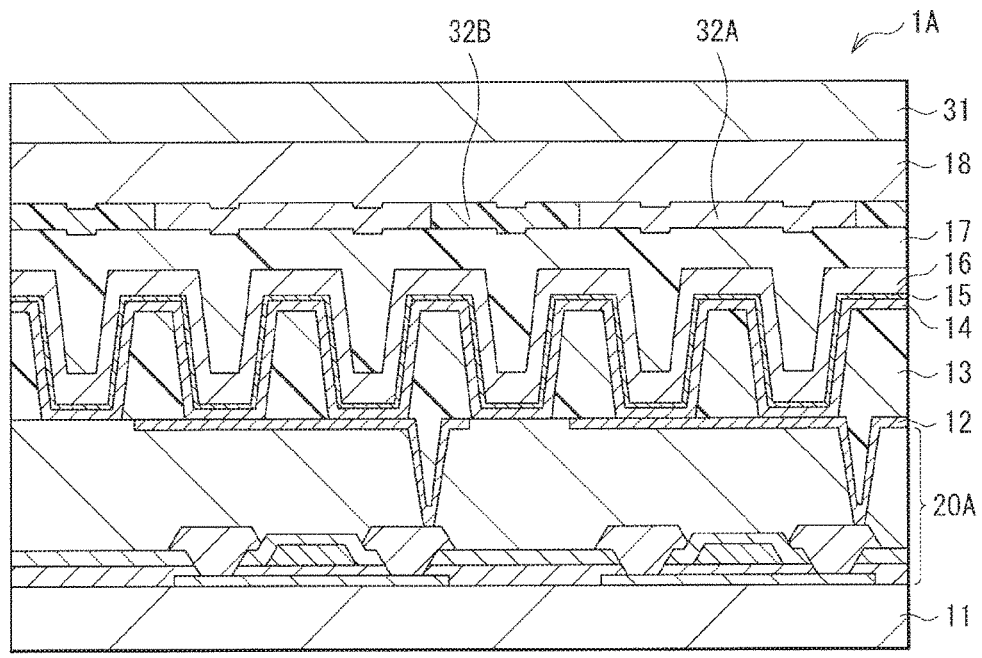

[FIG. 14]
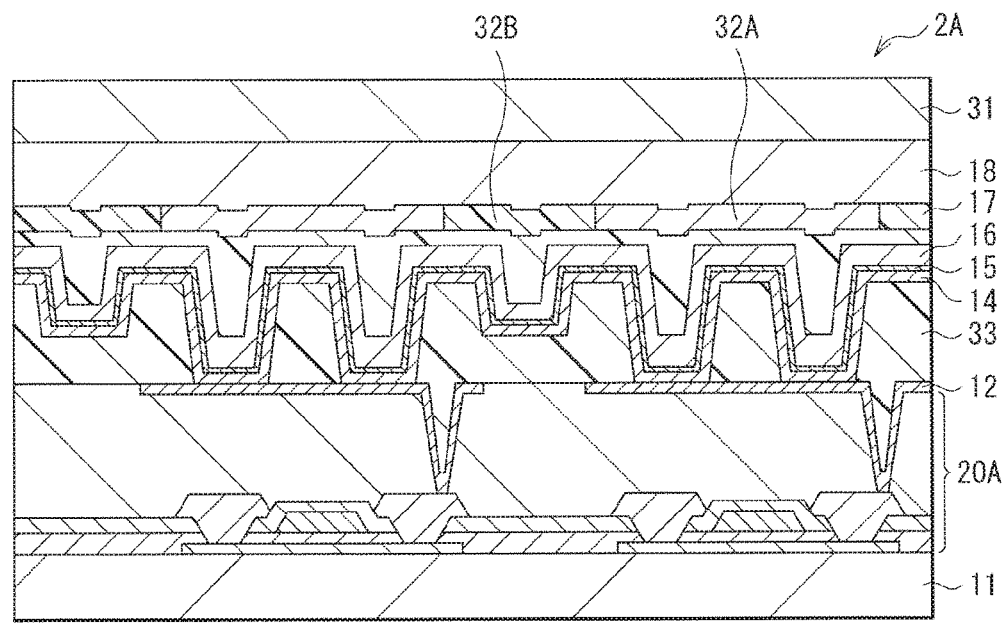
[FIG. 15]
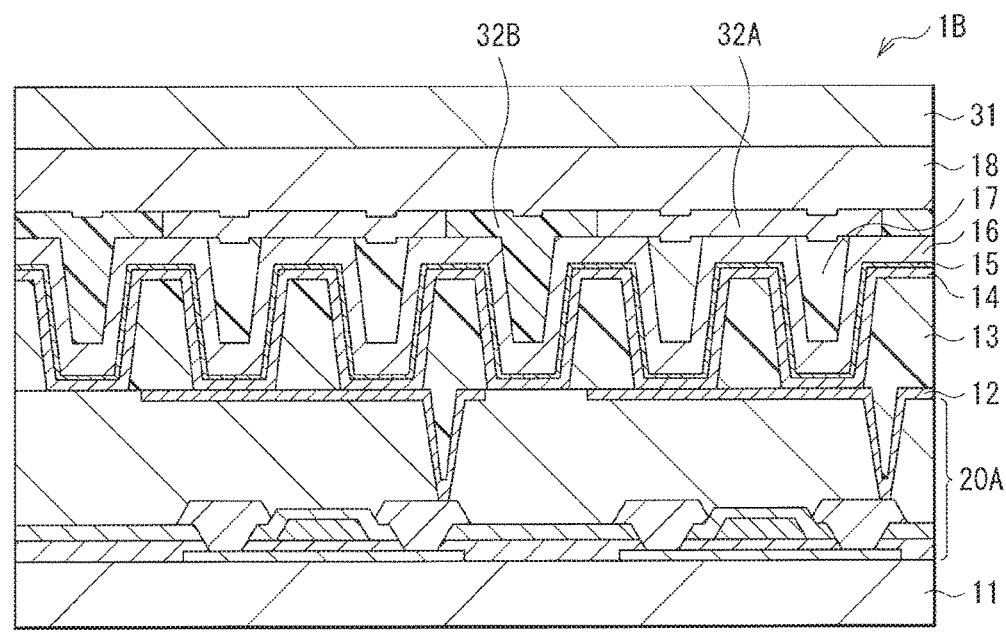

[ FIG. 16 ]
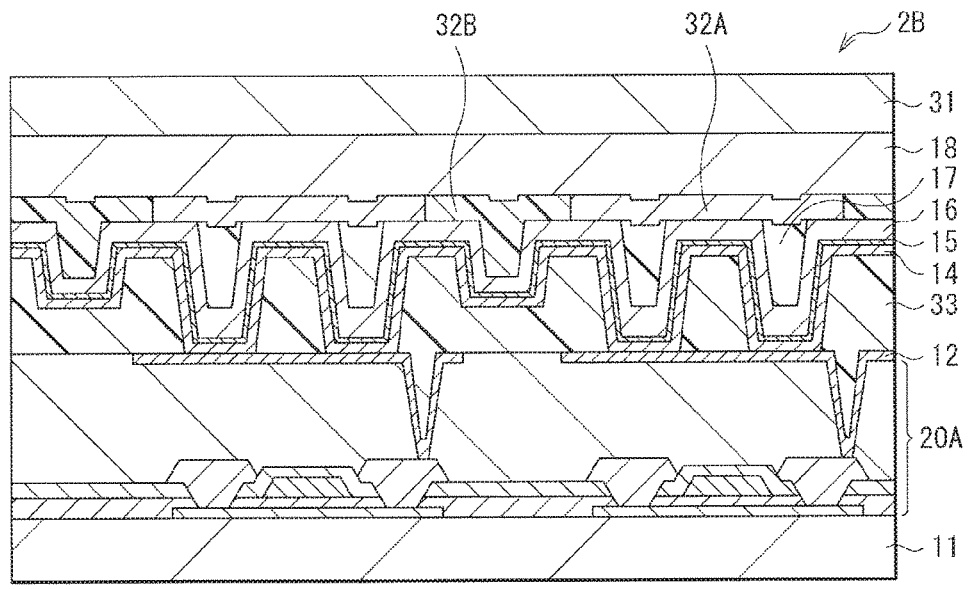
[ FIG. 17 ]
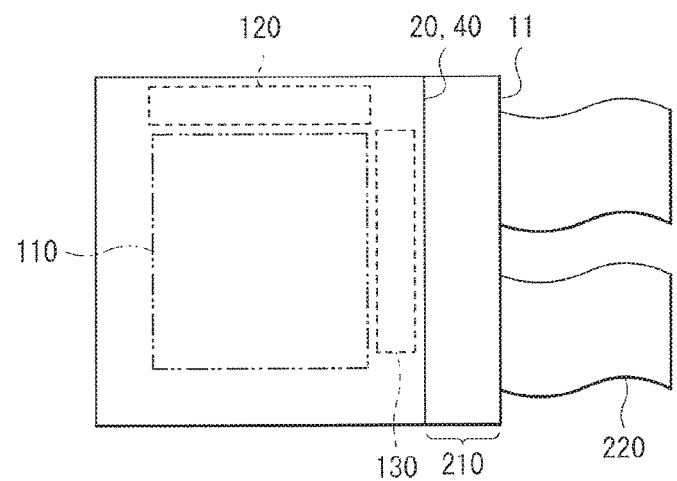

[ FIG. 18A ]
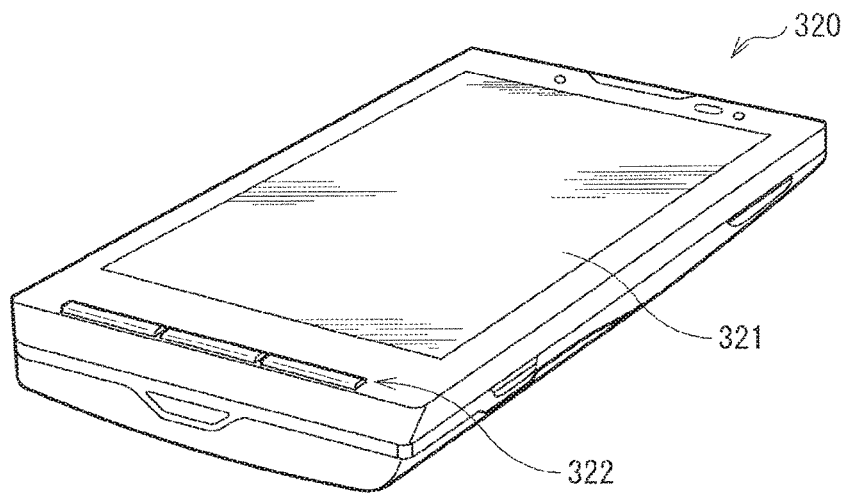
[ FIG. 18B ]
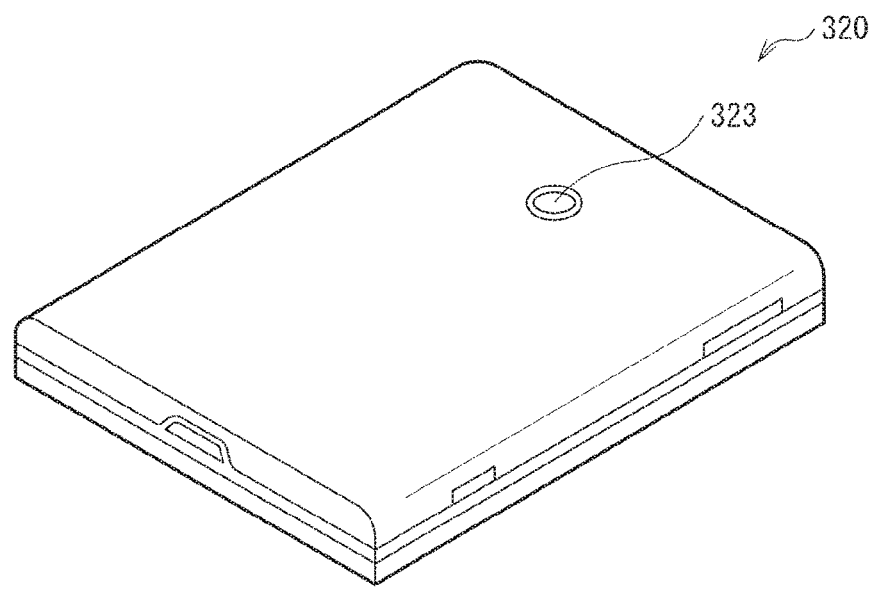

[ FIG. 19A ]
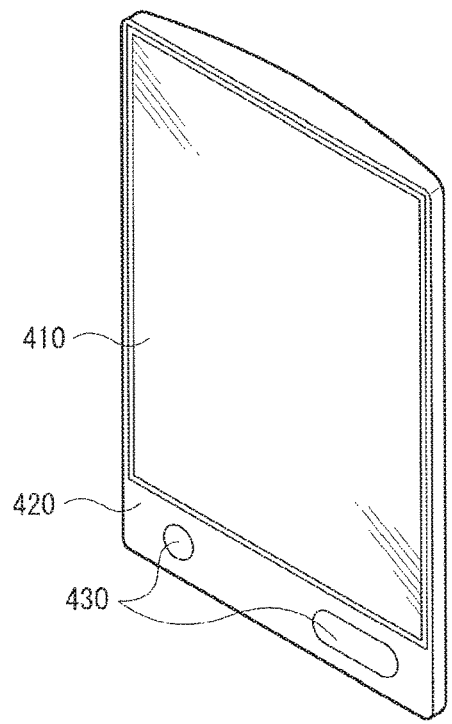
[ FIG. 19B ]
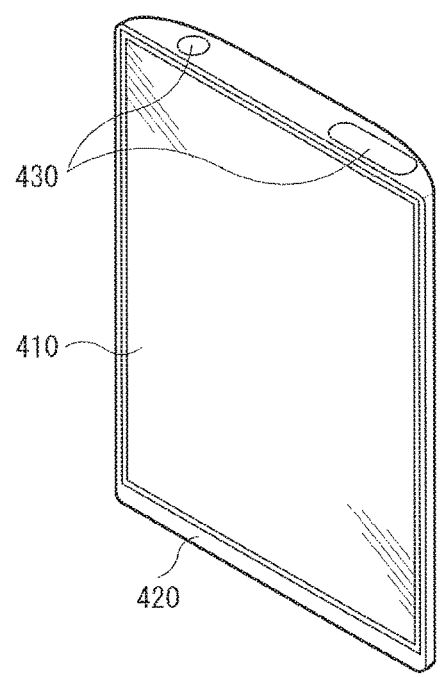

[ FIG. 20 ]
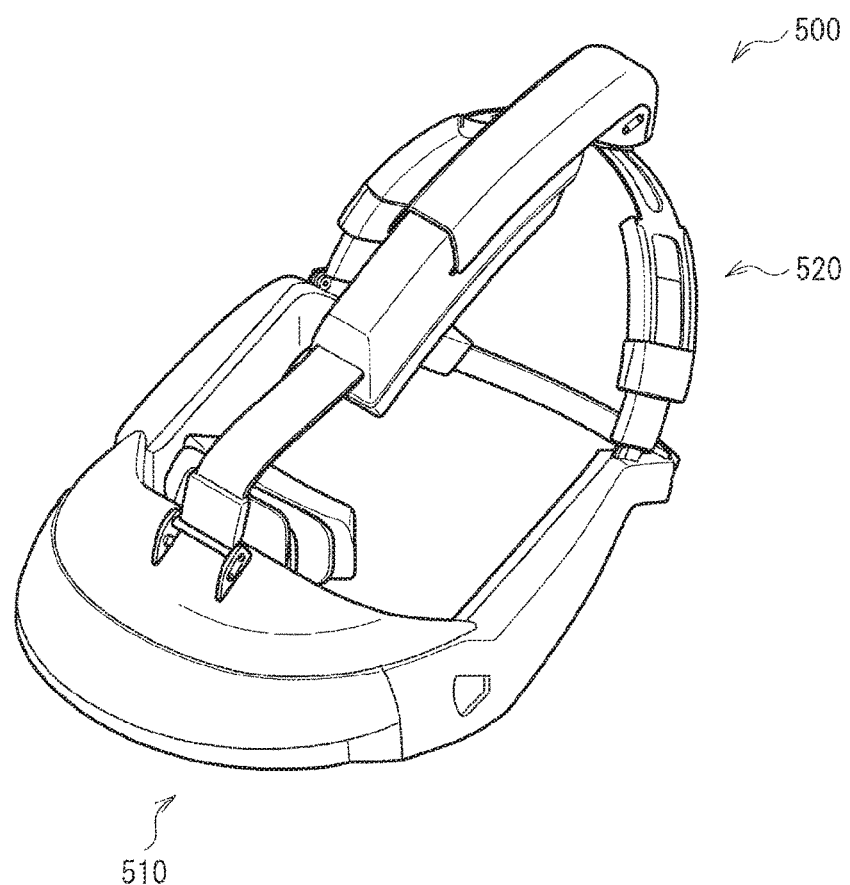

[ FIG. 21A ]
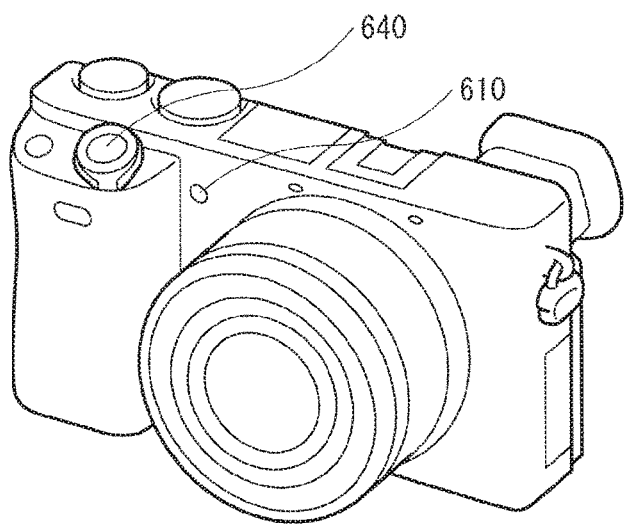
[ FIG. 21B ]
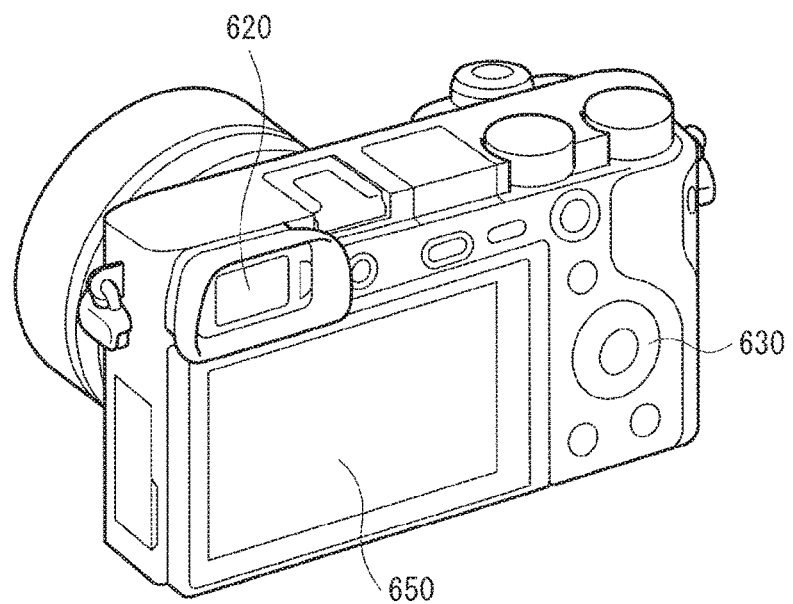

DISPLAY UNIT AND ELECTRONIC APPARATUS

CROSS REFERENCE TO RELATED APPLICATIONS

This application is a U.S. National Phase of International Patent Application No. PCT/JP2015/081718 filed on Nov. 11, 2015, which claims priority benefit of Japanese Patent Application No. JP 2014-251197 filed in the Japan Patent Office on Dec. 11, 2014. Each of the above-referenced applications is hereby incorporated herein by reference in its entirety.

TECHNICAL FIELD

The present disclosure relates to a display unit and an electronic apparatus that each include, for example, organic electroluminescence (EL) devices emitting light with use of an organic EL phenomenon.

BACKGROUND ART

In recent years, lighting apparatuses and organic electroluminescence display units that use organic electroluminescence devices (hereinafter simply called organic EL devices) as light-emitting devices have been becoming widespread. For the organic EL display units, it has been greatly demanded to develop a technology of extracting light efficiently. The organic EL display units typically have characteristics such as higher image visibility, lower power consumption, and faster response speed of devices as compared with liquid crystal display units needing light sources. However, deteriorated light extraction efficiency means that actual amount of light emission in the organic EL devices is utilized effectively, which causes a significant loss in terms of power consumption or any other aspects.

For improvement of the light extraction efficiency, for example, PTL 1 discloses a display unit having a reflector (reflecting structure). Such a display unit has a light-reflecting layer (first member) that is provided on a first substrate on which light-emitting devices are provided, and that reflects light from the light-emitting devices to display surface side, and a second member with which a clearance between a second substrate and the first member is filled. The second substrate is disposed in opposition to the first substrate. In the display unit, a refractive index ($n_1$) of the first member and a refractive index ($n_2$) of the second member are different from each other, which leads to at least a portion of light propagating through the second member being reflected on the surface of the first member facing the second member, thereby improving the light extraction efficiency.

CITATION LIST

Patent Literature

[PTL 1] Japanese Unexamined Patent Application Publication No. 2013-191533

SUMMARY OF THE INVENTION

For improvement of the light extraction efficiency with use of the reflector, it is important to control a shape of the reflector that is formed of the first member. The first member is typically made of a resist, and such a first member made of the resist is subject to deformation in a manufacturing process thereof. This causes issues that the reflector does not achieve a sufficient light extraction effect, and that variations in luminance are likely to take place.

Accordingly, it is desirable to provide a display unit and an electronic apparatus that each assure the improved light extraction efficiency and less variations in luminance.

A display unit according to one embodiment of the present technology includes: a plurality of pixels that are disposed in a regular manner; a plurality of first openings that are provided in each of the plurality of pixels; and one or more second openings that are provided in at least a portion of a peripheral edge of each of the plurality of pixels that are disposed in a regular manner.

An electronic apparatus according to one embodiment of the present technology includes the above-described display unit.

In the display unit and the electronic apparatus according to the respective embodiments of the present technology, the one or more second openings are provided in at least the portion of the peripheral edge of each of the plurality of pixels that are disposed in a regular manner and each include the plurality of first openings, resulting in reduced variations in the shapes of the first openings.

In the display unit and the electronic apparatus according to the respective embodiments of the present technology, the one or two or more second openings are provided in at least a portion of the peripheral edge of each of the plurality of pixels that are disposed in a regular manner and each include the plurality of first openings. This makes it possible to control the shapes of the first openings, and to improve light extraction efficiency. Further, it is also possible to reduce variations in luminance. It is to be noted that effects described here are not necessarily limitative, and effects achieved by the technology may be one or more of effects described in the present disclosure.

BRIEF DESCRIPTION OF DRAWINGS

FIG. 1 is a cross-sectional view of a display unit according to a first embodiment of the present disclosure.

FIG. 2 is a cross-sectional view of an opening that is provided on a pixel electrode of the display unit illustrated in FIG. 1.

FIG. 3 is a plan view for explaining an issue in a currently-available display unit.

FIG. 4A is a plan view of an example of the opening and a dummy opening that are provided on the pixel electrode of the display unit illustrated in FIG. 1.

FIG. 4B is a plan view of another example of the opening and the dummy opening that are provided on the pixel electrode of the display unit illustrated in FIG. 1.

FIG. 4C is a plan view of still another example of the opening and the dummy opening that are provided on the pixel electrode of the display unit illustrated in FIG 1.

FIG. 5 is a plan view of an example of a dummy opening in a display region illustrated in FIG. 1.

FIG. 6 is a plan view of another example of the dummy opening in the display region illustrated in FIG. 1.

FIG. 7 is a plan view of a configuration of the display unit illustrated in
FIG. 1.

FIG. 8 is a diagram illustrating an example of a pixel driving circuit illustrated in FIG. 7.

FIGS. 9A and 9B are schematic view for explaining an issue in a currently-available display unit.

FIG. 10 is a plan view of a portion of a display region and a peripheral region illustrated in FIG. 1.

FIG. 11 is a cross-sectional view of a display unit according to a second embodiment of the present disclosure.

FIG. 12 is a plan view of an example of an opening and a dummy opening that are provided on a pixel electrode of the display unit illustrated in FIG. 11.

FIG. 13 is a cross-sectional view of an example of a display unit according to a modification example 1 of the present disclosure.

FIG. 14 is a cross-sectional view of another example of the display unit according to the modification example 1 of the present disclosure.

FIG. 15 is a cross-sectional view of an example of a display unit according to a modification example 2 of the present disclosure.

FIG. 16 is a cross-sectional view of another example of the display unit according to the modification example 2 of the present disclosure.

FIG. 17 is a plan view of a simplified configuration of a module including any of the above-described display units.

FIG. 18A is a perspective view of an appearance of a smartphone of an application example 1 of the present disclosure as viewed from front.

FIG. 18B is a perspective view of an appearance of the smartphone illustrated in FIG. 11A as viewed from back.

FIG. 19A is a perspective view of an example of an appearance of a tablet computer of an application example 2 of the present disclosure.

FIG. 19B is a perspective view of another example of the appearance of the tablet computer of the application example 2 of the present disclosure.

FIG. 20 is a perspective view of an appearance of a head-mounted display of an application example 3 of the present disclosure.

FIG. 21A is a perspective view illustrating front side of a camera of an application example 4 of the present disclosure.

FIG. 21B is a perspective view of back side of the camera of the application example 4 of the present disclosure.

MODES FOR CARRYING OUT THE INVENTION

Hereinafter, some embodiments of the present disclosure are described in detail with reference to the drawings. It is to be noted that the description is given in the following order.
1. First Embodiment
(An example in which a dummy opening is provided at an outer edge of a pixel electrode)
1-1. Main Part Configuration
1-2. Overall Configuration
1-3. Workings and Effects
2. Second Embodiment
(An example in which a pixel separation film is provided at a bottom of a dummy opening)
3. Modification Examples
3-1. Modification Example 1 (an example in which a color filter is provided on drive substrate side)
3-2. Modification Example 2 (an example in which a dummy opening is buried with use of a black matrix)
4. Application Examples
[1. First Embodiment]
(1-1. Main Part Configuration)

FIG. 1 illustrates a cross-sectional configuration of a display unit (display unit 1) according to a first embodiment of the present disclosure. The display unit 1 is used as a high-definition display unit (for example, with a pixel number of 2048×1236) such as an electronic view finder (EVF) for camera use, and a head-mounted display (HMD), or as an organic EL television apparatus. A display region 110A and a peripheral region 110B are provided on a drive substrate 11, and the peripheral region 110B is provided at the peripheral edge of the display region 110A (see FIG. 7). The display unit 1 is a top-surface light emission (so-called top-emission type) display unit in which any of color light of R (red), G (green), and B (blue) is emitted from top surface (surface on the opposite side of the drive substrate 11) side with use of, for example, an organic EL device 10 that emits white light, and a color filter 32A to be hereinafter described.

In the present embodiment, openings (an opening 13A (first opening) and a dummy opening 13B (second opening)) are provided on a pixel electrode 12 and at an outer edge of each of the sub-pixels 5R, 5G and 5B, specifically, at a peripheral edge of the pixel electrode 12. The pixel electrode 12 is formed independently for each of sub-pixels 5R, 5G and 5B that configure a pixel.

The opening 13A that is provided on the pixel electrode 12 is provided in a pixel separation film 13 that is formed on the pixel electrode 12, and defines a light-emitting section of each of the pixels 5R, 5G and 5B. A plurality of openings 13A are preferably provided on each of the pixel electrodes 12, and the opening 13A takes a truncated cone shape, for example. FIG. 2 illustrates a cross-sectional shape of the opening 13A. The pixel separation film 13 is formed with a thickness of a height H, and a diameter R1 on the pixel electrode 12 side is smaller than a diameter R2 on display surface side in a portion of the opening 13A. In other words, on the pixel separation film 13, a sloped portion PS is provided to surround an opening WIN. The sloped portion PS takes a linear shape, and therefore a cross-section of the opening 13A takes a trapezoidal form as illustrated in FIG. 2.

An organic layer 14 including a light-emitting layer of the organic EL device 10 to be hereinafter described is provided inside the opening 13A. A counter electrode 15 and a protective layer 16 are provided on the organic layer 14, and a clearance between the protective layer 16 and a counter substrate 31 that is disposed on the display surface side is sealed by a sealing layer 17. Light emitted from the light-emitting layer travels toward a planar direction (normal direction (Z-axis direction)) of the organic layer 14 that is provided at a bottom of the opening 13A, or travels toward a direction shifted from the Z-axis direction. A part of the light traveling toward the direction shifted from the Z-axis direction enters a sloped portion of the pixel separation film 13, that is, the sloped portion PS of the opening 13A, and is reflected by the sloped portion PS. Here, the pixel separation film 13 and the sealing layer 17 are made of materials having different refractive indices from each other. In the sloped portion PS, the pixel separation film 13 and the sealing layer 17 that have different refractive indices from each other are located adjacently with the organic layer 14 including the light-emitting layer, the counter electrode 15, and the protective layer 16 interposed between, and thus the light is reflected by a difference in the refractive index. The reflected light travels to the display surface side to be extracted to the outside of the display unit 1. As described above, a structure for improving efficiency of extracting light to the outside by reflecting the light traveling toward the direction shifted from the Z-axis direction by the sloped portion PS by a difference in the refractive index is called a reflector structure.

To reflect light efficiently by the sloped portion PS, it is preferable to set each parameter in the following way. That is, the inclined angle θ preferably satisfies the following expression (1), and desirably satisfies the following expression (2), where an inclined angle of the sloped portion PS relative to a planar direction of the pixel electrode 12 is θ (unit: degree); a refractive index of a constituent material for the pixel separation film 13 is n1; a refractive index of a constituent material for the sealing layer 17 is n2; and a relationship in magnitude between n1 and n2 is n1<n2.

(Expression 1)

$$75.2-54(n2-n1) \leq \theta \leq 81.0-20(n2-n1) \quad (1)$$

$$76.3-46(n2-n1) \leq \theta \leq 77.0-20(n2-n1) \quad (2)$$

Further, the refractive index n1 and the refractive index n2 preferably satisfies $1.1 \leq n2 \leq 1.8$ and $n2-n1 \geq 0.20$. Examples of materials that satisfy such conditions include an acrylic-based resin material for the pixel separation film 13, and an epoxy-based resin material for the sealing layer 17.

The opening 13A is formed utilizing, for example, a photolithographic technique, as hereinafter described for details. Specifically, the opening 13A is formed in such a manner that a photoresist applied on the pixel electrode 12 and a planarizing layer 27 is exposed and developed using a mask having a pattern corresponding to the opening 13A, and thereafter baked. In the course of the baking, the photoresist softens temporarily, which causes variation. Such variation is caused by the inclined angle (taper angle) of the opening 13A, a film thickness of the photoresist, or a layout of the opening 13A, and it is likely that the openings 13A formed at an outermost circumference, in other words, a portion that does not face other openings 13A (for example, a portion within a dotted frame illustrated in FIG. 3) among the plurality of openings 13A that are provided on the pixel electrode 12 will become distorted. Therefore, luminance at the outer edge of each of the sub-pixels 5R, 5G and 5B was liable to become lower than luminance at a center of each of the sub-pixels 5R, 5G and 5B.

The dummy openings 13B serve to control shapes of the openings 13A that are provided on the pixel electrode 12, and are provided at the peripheral edge of the pixel electrode 12, more specifically, in at least a portion of a region where the pixel electrode 12 is not provided, as described above. For example, as illustrated in FIG. 3A, as locations for formation, the dummy openings 13B are preferably provided at locations where spacing intervals (W1 and W3) between adjacent two of the plurality of the openings 13A that are provided on the pixel electrode 12 and spacing intervals (W2 and W4) between the opening 13A at the outermost circumference and the dummy opening 13B are equal to one another. In other words, the dummy openings 13B are preferably formed at the same pitch as a pitch of the plurality of the openings 13A that are provided on the pixel electrode 12. Further, the dummy opening 13B may not necessarily take the same shape as the opening 13A, and a distance between adjacent two of the openings 13A may be substantially equal to a distance between the opening 13A and the dummy opening 13B. Specifically, the dummy opening 13B continuously extending to surround the openings 13A that are provided on the pixel electrode 12 may be provided, as illustrated in FIG. 4B.

It is to be noted that the pixel electrode 12 may not necessarily take a substantially rectangular shape, and may take a shape as illustrated in FIG. 4C, for example.

Each of FIG. 5 and FIG. 6 illustrates a layout of the plurality of pixel electrodes 12 and the dummy openings 13B that are disposed in the display region 110A. The dummy openings 13B that are provided at the outer edge of each of the pixels 5R, 5G and 5B may be combined to serve as the dummy opening 13B for the adjacent pixels 5R, 5G and 5B, for example. For example, the dummy openings 13B may be formed in a stripe pattern as illustrated in FIG. 5, or in a lattice pattern as illustrated in FIG. 6.

(1-2. Overall Configuration)

FIG. 7 illustrates an example of an overall configuration of the organic EL display unit 1 illustrated in FIG. 1, and a plurality of pixels 5 (red pixels 5R, green pixels 5G and blue pixels 5B) are disposed in a matrix pattern in the display region 110A. Further, in the peripheral region 110B that is located at a periphery (outer circumferential side and outer peripheral side) of the display region 110A, a signal line driving circuit 120 and a scan line driving circuit 130 are provided as drivers for image display.

A pixel driving circuit 140 is provided inside the display region 110. FIG. 8 illustrates an example of the pixel driving circuit 140. The pixel driving circuit 140 is an active-type driving circuit that is formed below the pixel electrode 12. In other words, the pixel driving circuit 140 includes a drive transistor Tr1 and a write transistor Tr2; a capacitor (storage capacitance) Cs between the transistors Tr1 and Tr2; and the organic EL device 10 that is coupled in series to the drive transistor Tr1 between a first power supply line (Vcc) and a second power supply line (GND). Each of the drive transistor Tr1 and the write transistor Tr2 is configured of a typical thin-film transistor (TFT), and a configuration thereof may have, for example but not limited to, an inversely-staggered structure (so-called bottom-gate type) or a staggered structure (top-gate type).

In the pixel driving circuit 140, a plurality of signal lines 120A are disposed in a column direction, and a plurality of scan lines 130A are disposed in a row direction. A crossing point of each of the signal lines 120A and each of the scan lines 130A corresponds to any one (sub-pixel) of the respective organic EL devices 10. Each of the signal lines 120A is coupled to the signal line driving circuit 120, and image signals are supplied from the signal line driving circuit 120 to a source electrode of the write transistor Tr2 through the signal lines 120A. Each of the scan lines 130A is coupled to the scan line driving circuit 130, and scan signals are sequentially supplied from the scan line driving circuit 130 to a gate electrode of the write transistor Tr2 through the scan lines 130A.

Hereinafter, each component part that configures the display unit 1 is described with reference to FIG. 1.

In the display unit 1, a display section 20 including a display layer 20B and a TFT layer 20A is provided between the drive substrate 11 and the counter substrate 31 that are disposed in opposition to each other. The display layer 20B includes the organic EL device 10, the protective layer 16, and the sealing layer 17 that are provided on the drive substrate 11 (to be exact, on a planarizing layer 26). The TFT layer 20A is provided between the drive substrate 11 and the display layer 20B, and the TFT layer 20A and the display layer 20B are sealed by the counter substrate 31 that includes a color filter 32A and a black matrix 32B (light-shielding film) with the sealing layer 17 in between. The organic EL device 10 has a configuration in which, for example, the pixel electrode 12, the organic layer 14, and the counter electrode 15 are stacked in this order, and the protective layer 16 is provided on the counter electrode 15. The organic EL device 10 is a so-called tandem device having a plurality of light-emitting layers of different colors inside the organic layer 14. The organic layer 14 has a configuration in which, for example, a hole supply layer, a first light-emitting layer, a charge generation layer, a second light-emitting layer, and an electron supply layer are stacked in this order from the pixel electrode 12 side (any of those component parts is not illustrated).

The drive substrate 11 is a support base in which the organic EL devices 10 are disposed and formed on one principal surface thereof. A constituent material of the drive substrate 11 may be any heretofore known material, and, for example, a film or a sheet made of quartz, glass, metal foil, or a resin material is used. Above all, quartz and glass are preferable. Examples of the resin material include a methacrylate resin as represented by polymethylmethacrylate (PMMA), polyester such as polyethylene terephthalate (PET), polyethylene naphthalate (PEN), and polybutylene naphthalate (PBN), and a polycarbonate resin. However, it is necessary to adopt a laminated structure or perform surface treatment to suppress water permeability or gas permeability.

A channel layer 21 is provided on the drive substrate 11. A gate insulating film 22 is provided on the channel layer 21. The gate insulating film is made of, for example, silicon oxide ($SiO_2$) or silicon nitride ($SiN_x$). A gate electrode 23 is provided on the gate insulating film 22 corresponding to the channel layer 21. The gate electrode 23 is made of, for example, molybdenum (Mo). The channel layer 21 and the gate electrode 23 configure a drive transistor DRTr (for example, Tr1 in FIG. 8), or any other element. It is to be noted that, in this example, the transistor is configured in the so-called top-gate structure in which the gate electrode 23 is provided on a top of the channel layer 21; however, the configuration is not limited thereto. Alternatively, the transistor may be configured in the so-called bottom-gate structure in which the channel layer 21 is provided on a top of the gate electrode 23. An interlayer insulating film 24 is provided on the gate electrode 23 and the gate insulating film 22. The interlayer insulating film 24 is made of, for example, a material similar to a material of the gate insulating film 22. In a portion of a region where the channel layer 21 is formed, a pair of source and drain electrodes 25A and 25B are provided to pass through the interlayer insulating film 24 and the gate insulating film 22. The source and drain electrodes 25A and 25B each may include three layers of titanium (Ti)/aluminum (Al)/titanium (Ti), for example. The planarizing layer 26 is provided on the interlayer insulating film 24 and the source and drain electrodes 25A and 25B. The planarizing layer 26 is made of, for example, an acrylic-based resin, a polyimide-based resin, a novolak-based resin, an epoxy-based resin, a norbornene-based resin, or any of these resins provided with a dispersed pigment. Connection holes 26A are formed in the planarizing layer 26, and electrical connection is made between the pixel electrode 12 to be hereinafter described and the source and drain electrodes 25A and 25B related to a source electrode of the drive transistor DTr.

For the pixel electrode 12, to efficiently inject holes into the light-emitting layer, it is preferable to use a constituent material having a large work function from a vacuum level of an electrode material. Specifically, for example, chromium (Cr), gold (Au), an alloy of tin oxide ($SnO_2$) and antimony (Sb), an alloy of zinc oxide (ZnO) and aluminum (Al), a silver (Ag) alloy, or an oxide of any of those metals and alloys may be used independently or in a mixed state.

Further, the pixel electrode 12 may be configured in a stacked structure using a layer with superior light reflectivity (lower layer) and a layer having light transmittance and large work function (upper layer) that is provided on a top of the lower layer. For a constituent material of the lower layer, it is preferable to use an alloy containing Al as a major constituent. As an accessory constituent, any element having a smaller work function than Al serving as the major constituent is used. As such an accessory constituent, it is preferable to use lanthanoid-series elements. The lanthanoid-series elements are not large in the work function: however, inclusion of those elements improves both stability of an anode and hole injection property of the anode. Alternatively, as the accessory constituent, any of elements such as silicon (Si) and copper (Cu) other than the lanthanoid-series elements may be used.

A content of the accessory constituent in an Al alloy layer configuring the lower layer is preferably about 10 wt % or less in total in a case where the accessory constituent is neodymium (Nd), nickel (Ni), or titanium (Ti) that serves to stabilize Al. This makes it possible to maintain reflectivity in the Al alloy layer, and to keep the Al alloy layer in a stable state in a manufacturing process of the organic EL device. Further, this ensures that processing accuracy and chemical stability are achieved. Moreover, conductivity of the pixel electrode 12, and adhesion between the pixel electrode 12 and the drive substrate 11 are also improved. It is to be noted that the above-described metals such as Nd are small in work function, and a hole-injection barrier therefore becomes larger in a case where a commonly available amine-based material is used for the hole supply layer to be hereinafter described. In this case, a layer in which an acceptor material such as 7,7,8,8-tetracyano-2,3,5,6-tetrafluoroquinodimethane (F4-TCNQ) is mixed with the amine-series material, or a p-doped layer using a material such as polyethylene dioxithiophene-polystyrene sulfonate (PEDOT-PSS) is formed on an boundary face of the pixel electrode 12, which makes it possible to reduce the hole-injection barrier and to suppress a rise in a drive voltage. In addition, the use of an azatriphenylene derivative to be hereinafter described allows the devices to be stabilized while suppressing a rise in the drive voltage.

For a constituent material of the upper layer, an oxide of an Al alloy, an oxide of molybdenum (Mo), an oxide of zirconium (Zr), an oxide of Cr, and an oxide of tantalum (Ta) may be used. For example, in a case where the upper layer is an oxide layer of an Al alloy (including a native oxide film) that contains the lanthanoid-series elements as the accessory constituent, oxides of the lanthanoid-series elements have high light transmittance, and thus the light transmittance of the upper layer containing such oxides is improved. As a result, reflectivity on the surface of the lower layer is kept at high level. Further, use of a transparent conductive layer of a material such as ITO (Indium Tin Oxide) or IZO (Indium Zinc Oxide) as the upper layer improves the electron injection characteristics of the pixel electrode 12. It is to be noted that each of the ITO and IZO has a large work function, and it is therefore possible to raise carrier injection efficiency and to improve adhesion between the pixel electrode 12 and the drive substrate 11 by using ITO or IZO for a layer on side that comes in contact with the drive substrate 11, that is, the lower layer.

It is to be noted that in a case where a drive method of the display unit that is configured with use of the organic EL device 10 is an active-matrix method, the pixel electrode 12 is provided in a state of being patterned on a pixel basis and being coupled to the drive transistor DRTr that is provided on the drive substrate 11. In this case, the display unit is configured so that the pixel separation film 13 is provided on the pixel electrode 12, and the surface of the pixel electrode 12 of each pixel is exposed from the opening 13A of the pixel separation film 13.

The pixel separation film 13 serves to assure insulation property of the pixel electrode 12 and the counter electrode 15, and to define a desired shape of a light-emitting region. Further, the pixel separation film 13 also has a function as a bulkhead to be used at the time of coating with use of an ink-jet method, a nozzle-coating method, or any other equivalent method in a manufacturing process. The pixel separation film 13 is preferably smaller in the refractive index than the sealing layer 17 to be hereinafter described, for example. As a constituent material of the pixel separation film 13, for example, an acrylic-based resin, a polyimide-based resin, a fluorine-based resin, a silicon-based resin, a fluorine-based polymer, a silicon-based polymer, a novolak-based resin, an epoxy-based resin, a norbornene-based resin, any of those resin materials with dispersed pigment, or any other equivalent material may be selected as appropriate. A thickness of the pixel separation film 13 is, for example, from 0.1 μm to 10 μm both inclusive, and a width of the opening 13A (WIN) is preferably equal to the thickness of the pixel separation film 13 in this case. By taking such a shape, light extraction efficiency is improved from relation with the inclined angle of the opening 13A and the refractive indices n1 and n2.

The hole supply layer is a buffer layer to improve efficiency of injecting holes into the light-emitting layer, and to prevent leakage. A thickness of the hole supply layer is preferably, for example, from 5 nm to 60 nm both inclusive depending on an overall configuration of the organic EL device 10, in particular, relation with the electron supply layer to be hereinafter described.

A constituent material of the hole supply layer may be selected as appropriate in terms of the electrodes (pixel electrode 12 and counter electrode 15) and materials of adjacent layers. Any of the following materials may be used as the constituent material. Examples of the material to be used include benzin, styryl amine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilben, or any of derivatives of these materials, or a heterocyclic conjugate-based monomer, oligomer, or polymer such as a polysilane-based compound, a vinylcarbazole-based compound, a thiophene-based compound, or an aniline-based compound.

Further, examples of the specific material include α-naphthylphenylphenylenediamine, porphyrin, metallic tetraphenylporphyrin, metallic naphthalocyanine, hexacyanoazatriphenylene, 7,7,8,8-tetracyanoquinodimethane (TCNQ), F4-TCNQ, tetracyano 4,4,4-tris (3-methylphenylphenylamino) triphenylamine, N,N,N',N'-tetrakis (p-toryl) p-phenylenediamine, N,N,N',N'-tetraphenyl-4,4'-diaminobiphenyl, N-phenylcarbazole, 4-di-p-torylaminostilbene, poly (paraphenylenevinylene), poly (thiphenevinylene), and poly (2, 2'-thienylpyrrole).

The light-emitting layer is a region in which holes injected from the pixel electrode 12 side and electrons injected from the counter electrode 15 side are recombined when an electric field is applied to the pixel electrode 12 and the counter electrode 15. Preferably, a constituent material of the light-emitting layer has a charge-injecting function (function of enabling, when an electric field is applied, to inject holes from the pixel electrode 12 and the hole supply layer and inject electrons from the counter electrode 15 and the electron supply layer), a transport function (function of transporting the injected holes and electrons using an electric field force), and a light-emitting function (function of providing a field for recombination of electrons and holes, leading to light emission).

The organic EL device 10 of the present embodiment is an organic EL device that is configured in such a manner that a first light-emitting layer and a second light-emitting layer are stacked with a charge generation layer in between to emit white light, as described above. The first light-emitting layer and the second light-emitting layer emit light of different colors from each other, and, for example, a blue light-emitting layer emitting blue light and a yellow light-emitting layer emitting yellow light are provided. Alternatively, the yellow light-emitting layer may be replaced by two layers of a red light-emitting layer emitting red light and a green light-emitting layer emitting green light.

The charge generation layer serves to couple the first light-emitting layer and the second light-emitting layer. The charge generation layer has a configuration of stacking, for example, a layer using a material having electron donor property and a layer using a material having electron acceptor property. As the material having the electron donor property, for example, it is possible to use a material having electron transport property doped with an N-type dopant. Examples of the N-type doped material include alkali metals, alkali earth metals, oxides of these metals, complex oxides, fluorides, and organic complexes. As the material having the electron acceptor property, for example, a material having hole transport property doped with a P-type dopant is used. For the material having hole transport property, for example, it is possible to use any of the materials cited for description of the hole supply layer. Examples of the P-type doped material include 7,7,8,8-tetracyano-2,3,5,6-tetrafluoroquinodimethane (F4-TCNQ) and hexaazacyanotriphenylene (HAT-6CN). A thickness of the charge generation layer is preferably, for example, from 1 nm to 100 nm both inclusive depending on the overall configuration of the organic EL device 10, and is more preferably from 10 nm to 50 nm both inclusive.

It is to be noted that a case where the two light-emitting layers are stacked with the charge generation layer in between is described here; however, the stacked configuration is not limited thereto, and three or more layers may be stacked. With an increase in the number of the stacked layers, it is possible to further improve light emission efficiency. Theoretical light emission efficiency lm/W in a case where the two light-emitting layers are stacked like a present modification example is unchanged, and current efficiency cd/A increases twofold. Further, the current efficiency cd/A increases threefold in a case where three layers are stacked.

The electron supply layer serves to transport electrons injected from the counter electrode 15 to each of the light-emitting layers. The electron supply layer has a configuration of stacking, for example, a layer including a material having electron transport property (electron transport layer, not illustrated) and a layer including a material having electron injection property (electron injection layer, not illustrated). A thickness of the electron supply layer is preferably, for example, from 10 nm to 50 nm both inclusive depending on the overall configuration of the organic EL device 10. In a case where a stacked structure of the electron transport layer and the electron injection layer is adopted, a thickness of the electron transport layer is preferably, for example, from 10 nm to 200 nm both inclusive, and is more preferably from 20 nm to 180 nm both inclusive. Further, a thickness of the electron injection layer is preferably, for example, 5 nm or more. This allows sufficient electron injection to be performed even for the pixels with significant irregularities.

For a constituent material of the electron transport layer, it is preferable to use an organic material having superior electron transport capability and high contact property with the counter electrode 15. For example, it is preferable to use an imidazole derivative, and a phenanthroline derivative having one or more phenanthroline rings. This stabilizes supply of the electrons to the light-emitting layers.

For a constituent material of the electron injection layer, it is possible to use an alkali earth metals such as calcium (Ca) and barium (Ba), or an alkali metal such as lithium, sodium, and cesium. Alternatively, an oxide, a complex oxide, or a fluoride of any of these metals may be used alone or as a mixture or alloy of any of such a metal, an oxide, a complex oxide, and a fluoride may be used to enhance stability.

A constituent material of the counter electrode 15 may be a material having a small work function and light transmittance. Examples of the specific material include alkali metal oxides such as $LiO_2$, $Cs_2O_3$, $Cs_2SO_4$, MgF, LiF, and $CaF_2$, alkali metal fluorides, alkali earth metal oxides, and alkali earth fluorides. As an alternative, a light-transmissive reflective material such as an alloy (for example, MgAg) containing aluminum (Al), calcium (Ca), or magnesium (Mg) may be used. The counter electrode 15 may be configured of a single layer including any one of the above-described materials, or a structure in which a plurality of layers including any of the above-described materials are stacked. In the case of such a stacked structure, forming, for example, an IZO film or a transparent $SiN_x$ film as an upper layer makes it possible to improve the conductivity, and to suppress deterioration in the electrodes.

It is to be noted that the counter electrode 15 may be formed independently for each of the sub-pixels 5R, 5Q and 5B that configure each of the pixels 5. Alternatively, the counter electrode 15 may be formed in the shape of a solid film inside the display region 110 to be used as a common electrode for the plurality of pixels 5. Further, in a case where the organic EL device is of a cavity structure, a semi-transmissive and semi-reflective material is preferably used for the counter electrode 15. As a result, emitted light that is subjected to multiple interference between a light-reflecting surface on the pixel electrode 12 side and a light-reflecting surface on the counter electrode 15 side is extracted from the counter electrode 15 side. In this case, an optical distance between the light-reflecting surface on the pixel electrode 12 side and the light-reflecting surface on the counter electrode 15 side is defined by a wavelength of light to be extracted, and a thickness of each layer is set to satisfy such an optical distance. In such a top-emission organic EL device, using the cavity structure in a proactive manner makes it possible to improve efficiency of extracting light to the outside, and to perform control of an emission spectrum.

The protective layer 16 has a thickness of, for example, 1 μm to 3 μm both inclusive, and may be made of an insulating material or a conductive material. For the insulating material, an inorganic amorphous insulating material such as amorphous silicon (α-Si), amorphous silicon carbide (α-SiC), amorphous silicon nitride (α-$Si_{1-x}N_x$), and amorphous carbon (α-C) are preferable. Since such an inorganic amorphous insulating material makes up no grain, the inorganic amorphous insulating material has low water permeability, and thus serves as a superior protective film. In addition, a silicon nitride (typically, $Si_3N_4$) film, a silicon oxide (typically $SiO_2$) film, a silicon nitride oxide ($SiN_xO_y$: composition ratio X>Y) film, a silicon oxynitride ($SiO_xN_y$: composition ratio X>Y) film, a CN (Carbon Nanotube) film that is a thin film containing carbon like DLC (Diamond-Like Carbon) as a major constituent, or any other equivalent film is used.

The sealing layer 17 is formed almost evenly on the protective layer 16 to serve as an adhesive layer. Examples of a material for the sealing layer 17 include an acrylic-based resin, a polyimide-based resin, a fluorine-based resin, a silicon-based resin, a fluorine-based polymer, a silicon-based polymer, a novolak-based resin, an epoxy-based resin, a norbornene-based resin, or any of these resins provided with a dispersed pigment. The refractive index of the sealing layer 17 is preferably greater than the refractive index (n1) of the pixel separation film 13. As previously mentioned, in a case where the refractive index of the sealing layer 17 is n2, it is preferable to use a material that satisfies $1.1 \leq n2 \leq 1.8$ and $n2-n1 \geq 0.20$.

The counter substrate 31 is located on the counter electrode 15 side of the organic EL device 10 to seal the organic EL devices 10 along with the sealing layer 17. The counter substrate 31 is made of a material such as glass transparent to light that is generated by the organic EL devices 10. The counter substrate 31 is provided with, for example, a light-shielding film acting as the black matrix 32B, and the color filter 32A. The counter substrate 31 extracts the light that is generated by the organic EL devices 10, and absorbs any outside light reflected by a wiring pattern between the organic EL devices 10, resulting in improvement in contrast.

The color filter 32A has a red filter, a green filter, and a blue filter that are disposed in this order. The red filter, the green filter, and the blue filter are formed tightly in a rectangular shape, for example. Each of the red filter, the green filter, and the blue filter is made of a resin mixed with a pigment, and is adjusted by selecting the pigment so that light transmittance in an intended red, green, or blue wavelength band is raised, and light transmittance in any other wavelength band is lowered. It is to be noted that on the organic EL device 10 that is provided in each of the sub-pixels 5R, 5Q and 5B, a color filter of a corresponding color is disposed.

The black matrix 32B is made of, for example, a black resin film that is mixed with a coloring agent and has an optical density of 1 or more, or a thin-film filter utilizing interference of the thin film. It is possible to form the black matrix 32B configured of the black resin film more inexpensively and more easily, which is therefore preferable. The thin-film filter is configured by stacking one or more thin films each of which is made of, for example, a metal, a metal nitride, or a metal oxide, and attenuates light utilizing the interference of the thin film. A specific example of the thin-film filter is a filter in which Cr and chromium oxide (III) ($Cr_2O_3$) are stacked alternately.

Here, it is possible to form the organic layer 14 using a dry process such as a vacuum evaporation method, an ion beam method (EB method), a molecular beam epitaxy method (MBE method), a sputtering method, and an OVPD (Organic Vapor Phase Deposition) method. The organic layer 14 is provided between the pixel electrode 12 and the counter electrode 15 that configure the organic EL device 10.

Further, in addition to the above-described methods, it is also possible to form the organic layer 14 using a wet process techniques such as coating methods including a laser transfer method, a spin-coating method, a dipping method, a doctor blade method, a discharge-coating method, and a spray-coating method, as well as printing methods including an ink-jet method, an offset printing method, a relief printing method, an intaglio printing method, a screen printing method, and a micro-gravure coating method. Alternatively, the combined use of the dry process and wet process may be also permitted depending on the property of each organic layer or each member.

For example, it is possible to manufacture the display unit 1 in the following manner.

First, the TFT layer 20A is formed on the drive substrate 11 using a currently-available technique, and thereafter the display layer 20B is formed. To start with, the pixel electrode 12 having a stacked structure of, for example, AlNd/Ag is formed on the planarizing layer 26 of the TFT layer 20A using, for example, a vacuum evaporation method and an etching method. It is to be noted that the pixel electrode 12 is electrically coupled to a source/drain region of the TFT through a contact plug (not illustrated). The source and drain electrodes 25A and 25B are coupled to a signal supply circuit (not illustrated).

Next, the pixel separation film 13 having the openings 13A and the dummy openings 13B is formed using, for example, photolithography. It is to be noted that, as another method of forming the pixel separation film 13, an inorganic material such as $SiO_2$, $SiN_x$, SiON, and $Al_2O_3$ may be used, and the pixel separation film 13 may be formed over a whole surface using photolithography and etching. As the following step, the organic layer 14 is formed on the pixel separation film 13 including a top of the pixel electrode 12 that is exposed to the bottom of the opening 13A using, for example, a vapor-deposition method, and thereafter the counter electrode 15 is formed over a whole surface of the display region 110A. A whole surface of the organic layer 14 that configures all of the organic EL devices 10 that are provided in the display region 110A is covered with the counter electrode 15. The counter electrode 15 is electrically isolated from the pixel electrode 12 by the pixel separation film 13 and the organic layer 14. The counter electrode 15 is formed using a vacuum evaporation method or a sputtering method that is a film formation method ensuring small energy of film-forming particles to the extent that the energy has no influence on the organic layer 14. Further, it is possible to prevent deterioration in the organic layer 14 caused by moisture and oxygen in the air, by forming the counter electrode 15 consecutively in the same vacuum evaporation system to be used for formation of the organic layer 14 without exposing the organic layer 14 in the air.

Next, the protective layer 16 is formed over a whole surface of the counter electrode 15, and thereafter the sealing layer 17 is further formed, thereby obtaining a light-reflecting layer (reflector structure) including the pixel separation film 13 and the sealing layer 17. Subsequently, the counter substrate 31 on which the color filter 32A and the black matrix 32B are formed is bonded with the light-reflecting layer with the sealing layer 17 in between. Such a step brings the display unit 1 to completion.

In the display unit 1, the scan signal is supplied to each of the sub-pixels 5R, 5Q and 5B through the gate electrode of the write transistor Tr2 from the scan line driving circuit 130, and the image signal is held in a storage capacitor Cs through the write transistor Tr2 from the signal line driving circuit 120. In other words, the drive transistor Tr1 is controlled to turn on or off depending on the signal held in the storage capacitor Cs, thereby injecting a drive current Id into the organic EL device to recombine holes and electrons, leading to light emission. The light passes through the pixel electrode 12 and the drive substrate 11 to be extracted in the case of the bottom-surface light emission (bottom-emission), and passes through the counter electrode 15, the color filter 32A, and the counter substrate 31 to be extracted in the case of the top-surface light emission (top-emission).

(1-3. Workings and Effects)

As previously mentioned, high image quality is typically desired for the organic EL display unit, and, for example, the organic EL display unit with a built-in reflector has been developed to improve light extraction efficiency. The reflector includes a first member and a second member. The first member is provided on a first substrate to reflect light from the light-emitting device to display surface side. A clearance between a second substrate that is disposed in opposition to the first substrate and a light-reflecting structure is filled with the second member, and the second member has a refractive index that is different from the refractive index of the first member. It is possible to improve light extraction efficiency by reflecting light having propagated through the second member on the surface of the first member.

To improve the light extraction efficiency with use of the reflector efficiently, it is important to control a shape of the reflector to be formed by the first member. However, the first member made of a photoresist has an issue that the photoresist becomes deformed in a manufacturing process thereof, and variations occur among a plurality of reflectors. Specifically, in a case where the first member is processed using a photolithographic technique, for example, the first member having an intended shape is patterned through exposure and development with use of a mask having a pattern opening on a substrate 111, as illustrated in FIG. 9 (A). However, the first member becomes deformed as illustrated in FIG. 9 (B) due to a baking process after development. This is because the photoresist that is the first member softens in the baking process, and becomes deformed due to an influence of surface tension to be hardened as it is. Such deformation due to the surface tension becomes worse with an increase in area. In other words, in a case where the plurality of reflectors are formed on the substrate 111, the deformation of shapes of the reflectors at an outermost circumference becomes worst.

On the contrary, in the present embodiment, the dummy openings 13B are provided at the outer edge of the pixel electrode 12 in which the plurality of openings 13A are provided. This makes it possible to reduce variations in the shapes of the openings 13A caused by variations in the layout of the openings 13A.

As described above, in the display unit 1 of the present embodiment, as a reflector structure, the dummy openings 13B are provided at the outer edge of the pixel electrode 12 in which the plurality of openings 13A are provided. As a result, variations in the layout of the plurality of openings 13A (in other words, a peripheral pattern of the openings 13A) that are provided on the pixel electrode 12 are reduced, which makes it possible to suppress occurrence of variations in the shapes of the openings 13A. This makes it possible to improve the light extraction efficiency, and to reduce variations in the luminance caused by variations in the openings 13A.

It is to be noted that, in the above-described first embodiment, the dummy opening 13B is provided at the outer edge of each of the sub-pixels 5R, 5Q and 5B, as illustrated in FIGS. 4A to 4C. However, for example, the dummy openings 13B may be formed only at the outer edge (for example, the peripheral region 110B) of the display region 110A that is configured in such a manner that the plurality of pixels are disposed, as illustrated in FIG. 10. In a case where the pixels are disposed at high definition as illustrated in FIG. 10, for example, a spacing interval between an opening 13AR that is provided on the pixel electrode 12 of the red pixel 5R in one pixel and an opening in a pixel adjacent to the one pixel, for example, an opening 13AG that is provided on the pixel electrode 12 of the green pixel 5G is substantially equal to a spacing interval between the opening 13AR and the opening 13AG in the one pixel. In this case, variations in the plurality of openings 13AR that are provided on the pixel electrode 12, specifically, occurrence of distortion of the openings 13AR at the outermost circumference is reduced. In such a case, as illustrated in FIG. 10, by forming the dummy openings 13B only at the peripheral edge of the display region 110A that is configured in such a manner that the plurality of pixels are disposed, deterioration in luminance in an outer edge portion of the display region 110A is reduced to achieve uniform luminance over the entire display region 110A. It is to be noted that an example where the dummy openings 13B are provided in the peripheral region 110B is cited here; however, the dummy openings 13B may not be necessarily formed in the peripheral region 110B. Specifically, the dummy openings 13B may be formed at the outer edge of a light-emitting region, that is, a non-emitting region that is formed by the opening 13A provided on each of the sub-pixels 5R, 5G and 5B. In such a case, a portion or entirety of each of the dummy openings 13B may be provided inside the display region 110A.

Hereinafter, the description is provided on a second embodiment and modification examples (modification examples 1 and 2) of the present disclosure. Any component parts essentially same as those in the above-described first embodiment are denoted with the same reference numerals, and the related descriptions are omitted as appropriate.

[2. Second Embodiment]

FIG. 11 illustrates a cross-sectional configuration of a display unit 2 according to a second embodiment of the present disclosure. The display unit 1 is used as a high-definition display unit (for example, with a pixel number of 2048×1236) such as an electronic view finder (EVF) and a head-mounted display (HMD), or as an organic EL television apparatus. FIG. 12 is a plan view of a positional relationship of the pixel electrode 12, the opening 13A, and a dummy opening 33B. In the display unit 2 in the present embodiment, at least a portion of each of the dummy openings 33B is provided on the pixel electrode 12, and each of the dummy openings 33B has a pixel separation film 33 at the bottom thereof. This is different from the above-described first embodiment.

For example, as illustrated in FIG. 11 and FIG. 12, at least a portion of each of the dummy openings 33B is provided to extend over the pixel electrode 12. The dummy openings 33B each has the pixel separation film 33 at the bottom thereof, thereby preventing light emission in a portion overlapping with the pixel electrode 12. It may be only necessary for a thickness (h) of the pixel separation film 33 at the bottom of the dummy opening 33B to allow for prevention of light emission in the dummy opening 33B. Further, a distance between the dummy opening 33B and the opening 13A is preferably substantially equal to a distance between the openings 13A, and a cross-sectional shape of the dummy opening 33B is preferably approximate to that of the opening 13A. Therefore, a depth (D) of the dummy opening 33B is preferably as large as possible.

As a method of forming the dummy openings 33B, for example, there are a method of performing one-shot exposure of the dummy openings 33B together with the openings 13A using a halftone mask at the time of patterning of the pixel separation film 33. In addition, it is also possible to form the dummy openings 33B by using a plurality of masks to adjust respective exposure amounts for the openings 13A and the dummy openings 33B.

As described above, in the display unit 2 of the present embodiment, the dummy openings 33B that are provided to extend over the pixel electrode 12 are configured in a structure in which the pixel separation film 33 remains at the bottom using, for example, a half-exposure method. As a result, even in the display unit without a sufficient spacing interval between the adjacent pixels, it is possible to reduce variations in the shapes of the openings 13A that each serve as a reflector structure. This makes it possible to improve efficiency of extracting light with use of the reflector structure, and to provide the display unit 2 in which variations in luminance are reduced.

[3. Modification Examples]

(3-1. Modification Example 1)

FIG. 13 illustrates a cross-sectional configuration of a display unit 1A according to a modification example 1 of the first embodiment of the present disclosure. FIG. 14 illustrates a cross-sectional configuration of a display unit 2A according to a modification example 1 of the second embodiment of the present disclosure. As with the above-described first embodiment and second embodiment, any of the display unit 1A and the display unit 2A has the dummy openings 13B (33B) at the outer edge of the pixel electrode 12 having the openings 13A that each serve as the reflector structure. However, the present modification example is different from any of the first embodiment and second embodiment in that the color filter 32A and the black matrix 32B are provided on the drive substrate 11 side, specifically, on the sealing layer 17 side. The counter substrate 31 is bonded on the color filter 32A and the black matrix 32B with an adhesive layer 18 using, for example, an acrylic resin or an epoxy resin in between.

In any of the display unit 1A and the display unit 2A, in addition to the effects in the above-described first embodiment and second embodiment, it is possible to shorten a distance between the light-emitting layer of the organic EL device 10 and each of the color filter 32A and the black matrix 32B. This ensures effects that viewing angle characteristics are improved, and it is possible to suppress occurrence of color mixture that is caused by intrusion of light from adjacent pixels. Further, in bonding the drive substrate 11 and the counter substrate 31 with each other, the necessity of alignment of color filters 33AR, 33AG and 33AB corresponding to the color pixels (sub-pixels; the red pixel 5R, the green pixel 5G and the blue pixel 5B) is eliminated. Moreover, it is unnecessary to form the color filters on the counter substrate 31 using the photolithographic technique, which alleviates f heat resistance (thermal deformation) and chemical resistance (solvent resistance and alkali resistance) that is demanded for the counter substrate 31. As a result, a degree of freedom for material selection of the counter substrate 31 is improved, which allows for cost reduction.

(3-2. Modification Example 2)

FIG. 15 illustrates a cross-sectional configuration of a display unit 1B according to a modification example 2 of the first embodiment of the present disclosure. FIG. 16 illustrates a cross-sectional configuration of a display unit 2B according to a modification example 2 of the second embodiment of the present disclosure. As with the above-described first embodiment and second embodiment, any of the display unit 1B and the display unit 2B has the dummy openings 13B (33B) at the outer edge of the pixel electrode 12 having the openings 13A that each serve as the reflector structure. However, the present modification example is different from any of the first embodiment and second embodiment in that the color filter 32A and the black matrix 32B are provided on the drive substrate 11 side, and each of the dummy openings 13B and 33B are filled with the black matrix 32B.

In any of the display unit 1B and the display unit 2B, in addition to the effects in the above-described first embodiment and second embodiment, such an effect is achieved that intrusion of light from adjacent pixels is shielded by filling each of the dummy openings 13B and 33B with the black matrix 32B, thereby allowing for prevention of occurrence of color mixture. Further, the color filter 32A and the black matrix 32B are provided on the drive substrate 11 side; therefore, the effects similar to those of the above-described modification example 1 are achieved.

[4. Application Examples]

(Module and Application Example Thereof)

Any of the display units 1, 2, 1A, 1B, 2A, and 2B mentioned in the above-described embodiments and the modification examples thereof may be applicable to display units of electronic apparatuses in various fields that display externally-inputted image signals or internally-generated image signals, as a still image or a moving image. Examples of the electronic apparatuses include television apparatuses, digital cameras, notebook personal computers, mobile terminals such as mobile phones, and video cameras. In particular, any of the display units 1, 2, 1A, 1B, 2A, and 2B is suitably applied to small-to-medium-sized displays for mobile apparatuses. Examples will be described below.

(Module)

Any of the display units 1, 2, 1A, 1B, 2A, and 2B of the above-described embodiments and examples is incorporated into various electronic apparatuses according to application examples 1 to 3 to be hereinafter described as a module as illustrated in FIG. 16, for example. This module is configured, for example, by providing a region 210 exposed from a protective layer 30 and a sealing substrate 40 on one side of the drive substrate 11 and extending wiring patterns of the signal line driving circuit 120 and the scan line driving circuit 130 to form external connection terminals (not illustrated) in the exposed region 210. An FPC (Flexible Printed Circuit) 220 for signal input and output may be provided to the external connection terminals.

(Application Example 1)

FIGS. 18A and 18B each illustrate an appearance of a smartphone 320 according to the application example 1. For example, the smartphone 320 has a display section 321 and an operating section 322 on front side, and a camera 323 on back side, and any of the display units 1, 2, 1A, 1B, 2A, and 2B of the above-described embodiments and examples is mounted in the display section 321.

(Application Example 2)

FIGS. 19A and 19B each illustrate an appearance configuration of a tablet computer. The tablet computer includes, for example, a display section 410 (display unit 1), a non-display section (housing) 420, and an operating section 430. The operating section 430 may be provided on front side of the non-display section 420 as illustrated in FIG. 19A, or may be provided on a top surface of the non-display section 420 as illustrated in FIG. 19B. Any of the display units 1, 2, 1A, 1B, 2A, and 2B may be mounted in a PDA or any other similar apparatus having a configuration similar to that of the tablet computer illustrated in FIGS. 19A and 19B.

(Application Example 3)

FIG. 20 illustrates an appearance of a head-mounted display 500 according to the application example 3. The head-mounted display 500 has a display section 510 (any of the display units 1, 2, 1A, 1B, 2A, and 2B), and a mounting section 520.

(Application Example 4)

FIGS. 21A and 21B each illustrate an appearance configuration of a digital still camera according to an application example 4, and illustrate front side and back side, respectively. The digital still camera has, for example, a light-emission section 610 for a flash, a view finder 620 (any of the display units 1, 2, 1A, 1B, 2A, and 2B), a menu switch 630, a shutter button 640, and a display section 650.

The present disclosure is described thus far with reference to the first and second embodiments, the modification examples 1 and 2, and the application examples; however, the present disclosure is not limited thereto, and may be modified in a variety of ways.

For example, in the above-described first embodiment, the opening 13A is illustrated in a circular shape; however, the shape of the opening 13A is not limited thereto, and the opening 13A may take a rectangular shape. Further, a layout of the plurality of openings 13A on the pixel electrode 12 is also not limited specifically, and, for example, a so-called close packing arrangement may be applicable.

Further, for example, the material and thickness of each layer, the method and conditions of forming each layer are not limited to those described in the above-described embodiments and examples, and each layer may be made of any other material with any other thickness by any other method under any other conditions.

In addition, in the above-described embodiments and examples, the description is provided by citing a specific example of the configuration of the organic EL device 10; however, it is not necessary to provide all the layers, and any other layer may be further provided.

Moreover, in the above-described embodiments and examples, the description is provided on the case of the active-matrix display unit; however, the present disclosure is also applicable to a passive-matrix display unit. Further, a configuration of the pixel driving circuit for the active-matrix drive is not limited to the configuration mentioned in the above-described embodiments, and capacitors or transistors may be added where appropriate. In such a case, depending on modification of the pixel driving circuit, a necessary driving circuit may be added in addition to the above-described signal line driving circuit 120 and scan line driving circuit 130.

It is to be noted that the effects described herein are merely exemplified and non-limiting, and effects of the present disclosure may be other effects, or may further include other effects.

It is to be noted that the present technology may be configured as follows.

(1)
A display unit, including:
a plurality of pixels that are disposed in a regular manner;
a plurality of first openings that are provided in each of the plurality of pixels; and
one or more second openings that are provided in at least a portion of a peripheral edge of each of the plurality of pixels that are disposed in a regular manner.

(2)
The display unit according to (1), in which
each of the pixels has a plurality of sub-pixels, and two or more of the first openings are provided for each of the sub-pixels, and one or more of the second openings are provided in at least a portion of an outer edge of each of the sub-pixels.

(3)
The display unit according to (2), in which the second openings are provided at the same pitch as a pitch of the two or more of the first openings that are provided in each of the sub-pixels.

(4)
The display unit according to (2) or (3), in which the second openings are provided at the same pitch as the two or more of the first openings that are provided in each of the sub-pixels.

(5)
The display unit according to (3), in which the second openings that are provided at respective sides of each of the sub-pixels are continuous with one another.

(6)
The display unit according to any one of (2) to (5), in which the second openings are provided in a stripe pattern between the sub-pixels.

(7)
The display unit according to any one of (2) to (5), in which the second openings are provided in a lattice pattern between the sub-pixels.

(8)
The display unit according to any one of (2) to (7), in which
each of the sub-pixels has a light-emitting device in which a first electrode, an organic layer including a light-emitting layer, and a second electrode are stacked in this order, and
the first openings are provided on the first electrode, and the second openings are provided at an outer edge of the first electrode.

(9)
The display unit according to any one of (1) to (8), in which
the display unit has a display region at which the plurality of pixels are disposed, and a peripheral region that is provided at a peripheral edge of the display region, and
the second openings are provided in the peripheral region.

(10)
The display unit according to any one of (1) to (8), in which the first openings are formed in a light-emitting region in which the plurality of pixels are provided, and the second openings are formed in a non-emitting region.

(11)
An electronic apparatus provided with a display unit, the display unit including:
a plurality of pixels that are disposed in a regular manner;
a plurality of first openings that are provided in each of the plurality of pixels; and
one or more second openings that are provided in at least a portion of a peripheral edge of each of the plurality of pixels that are disposed in a regular manner.

This application claims the priority on the basis of Japanese Patent Application No. 2014-251197 filed on Dec. 11, 2014 in Japan Patent Office, the entire contents of which are incorporated in this application by reference.

Those skilled in the art could assume various modifications, combinations, subcombinations, and changes in accordance with design requirements and other contributing factors. However, it is understood that they are included within a scope of the attached claims or the equivalents thereof.

The invention claimed is:

1. A display unit, comprising:
a plurality of pixels;
a plurality of first openings in each of the plurality of pixels; and
at least one second opening in at least a portion of a peripheral edge of each of the plurality of pixels, wherein each of the plurality of pixels includes a plurality of sub-pixels, and wherein each of the plurality of sub-pixels are associated with at least two first openings of the plurality of first openings.

2. The display unit according to claim 1, wherein at least one opening of the at least one second opening is in at least a portion of an outer edge of each of the plurality of sub-pixels.

3. The display unit according to claim 2, wherein each of the plurality of sub-pixels includes a substantially rectangular shape, and the at least one opening of the at least one second opening is at each side of each of the plurality of sub-pixels.

4. The display unit according to claim 2, wherein the at least one second opening is at a same pitch as a pitch of the at least two first openings of the plurality of first openings.

5. The display unit according to claim 3, wherein the each of at least one second opening is in continuous arrangement at respective sides of each of the plurality of sub-pixels.

6. The display unit according to claim 2, wherein the at least one second opening is in a stripe pattern between the plurality of sub-pixels.

7. The display unit according to claim 2, wherein the at least one second opening is in a lattice pattern between the plurality of sub-pixels.

8. The display unit according to claim 2, wherein each of the plurality of sub-pixels includes a light-emitting device,
wherein the light-emitting device includes a first electrode, an organic layer, and a second electrode in order,
wherein the organic layer includes a light-emitting layer, and
wherein the plurality of first openings are on the first electrode, and the at least one second opening is at an outer edge of the first electrode.

9. The display unit according to claim 1, further includes a display region,
wherein the display region includes the plurality of pixels,
wherein a peripheral region is at a peripheral edge of the display region, and
wherein the at least one second opening is in the peripheral region.

10. The display unit according to claim 1, wherein the plurality of first openings are in a light-emitting region, and
wherein the plurality of pixels are in the light-emitting region, and the at least one second opening is in a non-emitting region.

11. An electronic apparatus, comprising:
a display unit that comprises:
a plurality of pixels;
a plurality of first openings in each of the plurality of pixels; and
at least one second opening in at least a portion of a peripheral edge of each of the plurality of pixels,
wherein each of the plurality of pixels includes a plurality of sub-pixels, and
wherein each of the plurality of sub-pixels are associated with at least two first openings of the plurality of first openings.

* * * * *